United States Patent [19]

Noguchi

[11] Patent Number: 5,587,834

[45] Date of Patent: Dec. 24, 1996

[54] SEMICONDUCTOR DEVICE MANUFACTURING METHOD AND PROJECTION EXPOSURE APPARATUS USING THE SAME

[75] Inventor: Miyoko Noguchi, Tokyo, Japan

[73] Assignee: Canon Kabushiki Kaisha, Tokyo, Japan

[21] Appl. No.: 10,789

[22] Filed: Jan. 29, 1993

[30] Foreign Application Priority Data

Jan. 31, 1992 [JP] Japan ................... 4-046265

[51] Int. Cl.$^6$ .................... G02B 5/18; G02B 27/00
[52] U.S. Cl. .................... 359/558; 359/577; 359/564; 430/5; 355/53; 355/67
[58] Field of Search ................ 355/53, 67; 430/5; 359/558, 559, 562, 563, 564, 566, 577

[56] References Cited

U.S. PATENT DOCUMENTS

| | | | |
|---|---|---|---|
| 3,771,872 | 11/1973 | Nightingale et al. | 355/125 |
| 3,795,446 | 3/1974 | Houston | 355/78 |
| 4,159,164 | 6/1979 | Dammann et al. | 359/558 |
| 4,521,082 | 6/1985 | Suzuki et al. | 359/386 |
| 4,547,037 | 10/1985 | Case | 359/15 |
| 4,589,769 | 5/1986 | Matsuki | 355/71 |
| 4,634,240 | 1/1987 | Suzuki et al. | 359/369 |
| 4,645,924 | 2/1987 | Suzuki et al. | 250/236 |
| 4,895,780 | 1/1990 | Nissan-Cohen et al. | 430/5 |
| 4,947,413 | 8/1990 | Jewell et al. | 359/559 |
| 5,059,013 | 10/1991 | Jain | 359/894 |
| 5,194,345 | 3/1993 | Rolfson | 430/5 |
| 5,208,629 | 5/1993 | Matsuo et al. | 355/67 |
| 5,229,255 | 7/1993 | White | 430/5 |
| 5,242,770 | 9/1993 | Chen et al. | 430/5 |
| 5,248,575 | 9/1993 | Ogoshi | 430/5 |
| 5,275,894 | 1/1994 | Tanabe | 430/5 |
| 5,300,378 | 4/1994 | Minami | 430/5 |
| 5,305,054 | 4/1994 | Suzuki et al. | 355/53 |
| 5,352,550 | 10/1994 | Okamoto | 430/5 |
| 5,357,311 | 10/1994 | Shiraishi | 355/53 |
| 5,367,404 | 11/1994 | Hayata | 359/558 |
| 5,418,093 | 5/1995 | Asai et al. | 430/5 |
| 5,424,153 | 6/1995 | Asai | 430/5 |
| 5,489,509 | 2/1996 | Kawabata et al. | 430/5 |

FOREIGN PATENT DOCUMENTS

| | | | |
|---|---|---|---|
| 0486316 | 5/1992 | European Pat. Off. | G03F 7/20 |
| 1579159 | 7/1969 | France . | |
| 57-62052 | 4/1982 | Japan | G03F 1/00 |
| 1227151 | 4/1971 | United Kingdom | G02B 27/00 |

OTHER PUBLICATIONS

Fukuda, et al., Nikkei Microdevices, pp. 108 through 114, Jul. 1990.

*Primary Examiner*—Paul M. Dzierzynski
*Assistant Examiner*—John Juba, Jr.
*Attorney, Agent, or Firm*—Fitzpatrick, Cella, Harper & Scinto

[57] ABSTRACT

A semiconductor device manufacturing method is disclosed, which includes the steps of illuminating obliquely an original having a grating-like pattern, with a light beam having a main wavelength $\lambda$, and projecting a portion of diffraction light produced by the pattern onto a pupil plane of a projection optical system having a numerical aperture NA, so as to project the pattern onto a predetermined plane related to a photosensitive substrate, wherein the original has a partially isolated pattern and an auxiliary pattern, the partially isolated pattern is such a pattern having no adjoining pattern within a range of $D \leq (\lambda/NA)$ where D is the distance from one side thereof as measured on the predetermined plane, the auxiliary pattern has a linewidth L which satisfies the relation $L \leq 0.2(\lambda/NA)$ and it extends parallel to at least a portion of the partially isolated pattern, the auxiliary pattern is provided at a distance S from one side of the partially isolated pattern in the direction substantially perpendicular to the one side, and the distance S is within a rage of $0 \leq S \leq 0.1(\lambda/NA)$.

4 Claims, 13 Drawing Sheets

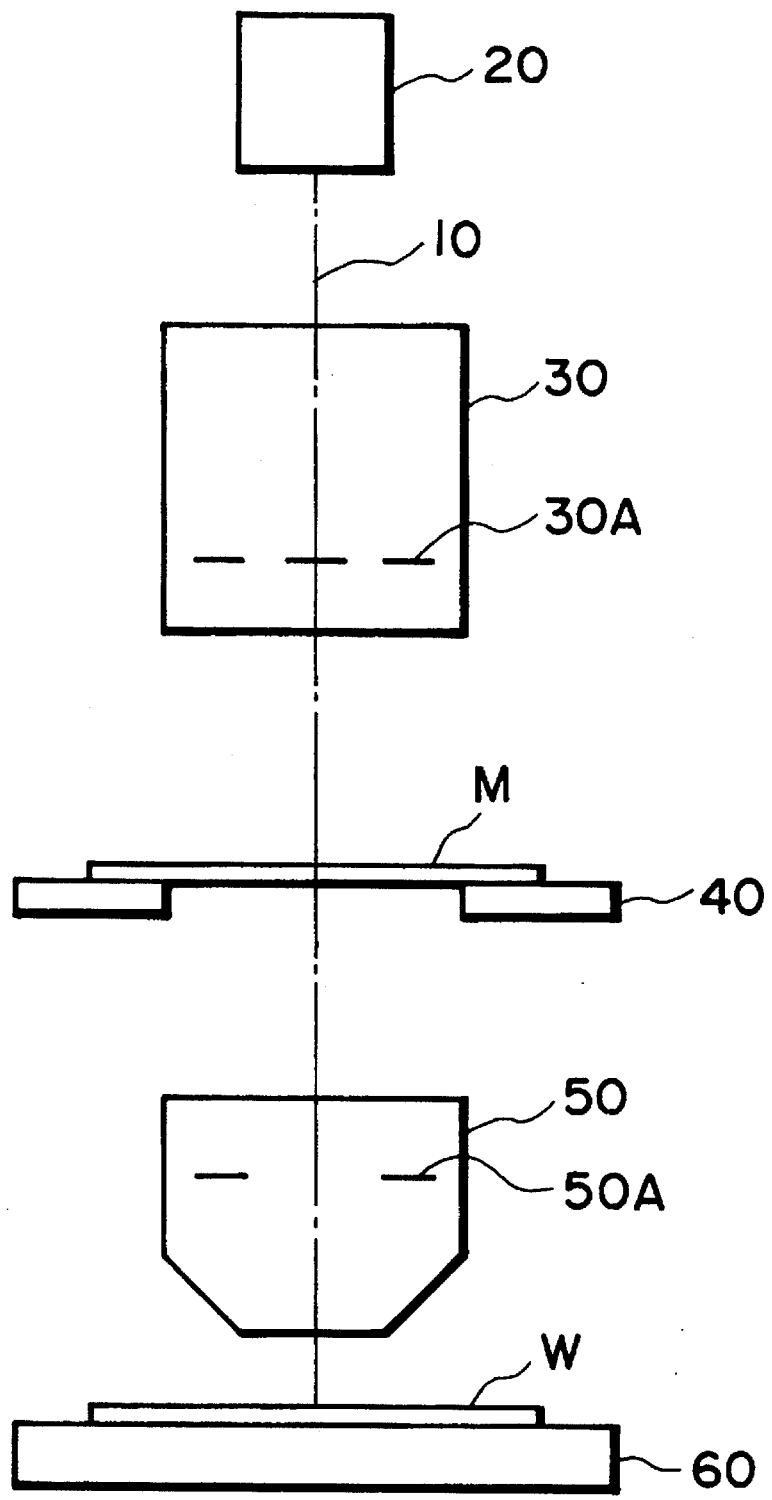
F I G. 1

FIG.6A
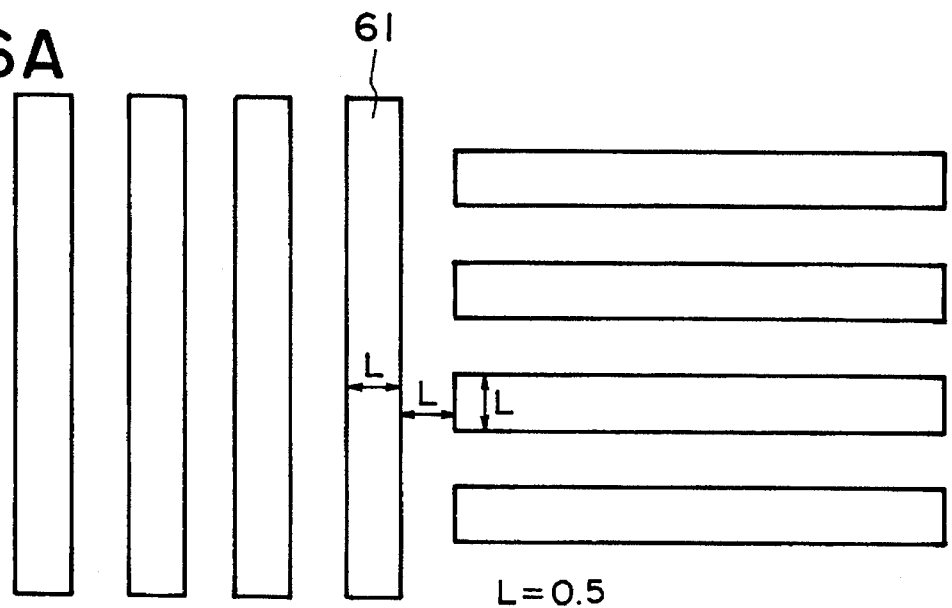
L=0.5
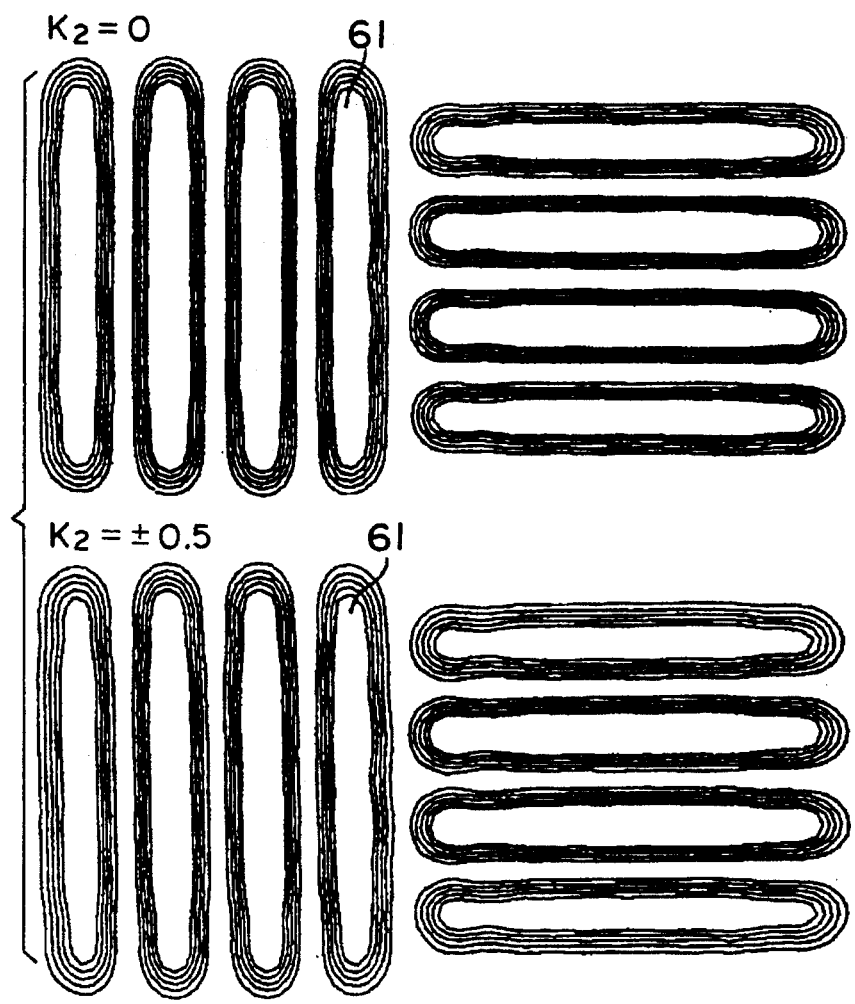
FIG.6B

FIG. 7A
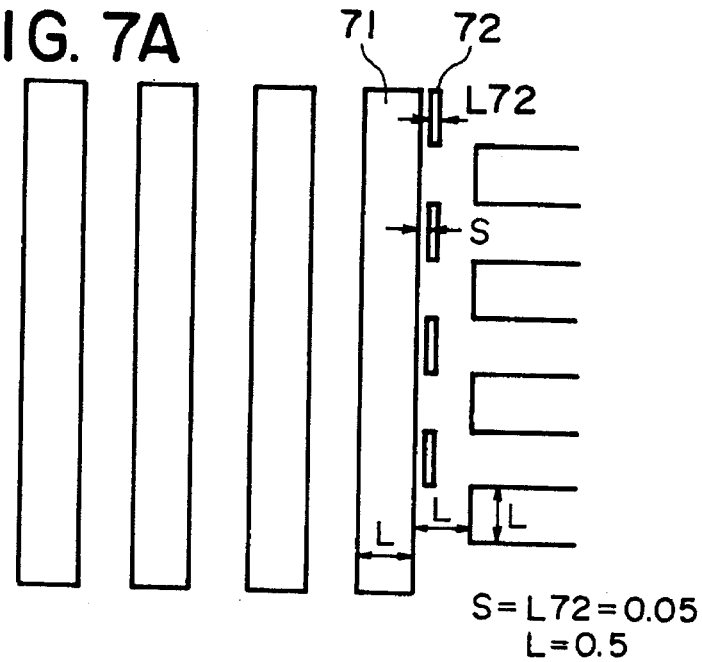
$S = L72 = 0.05$
$L = 0.5$
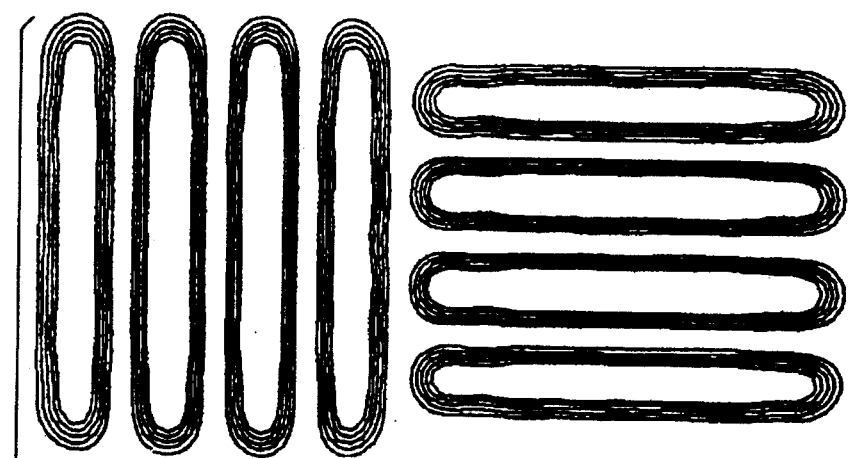
FIG. 7B $S = L92 = 0.05$
$L = 0.5$

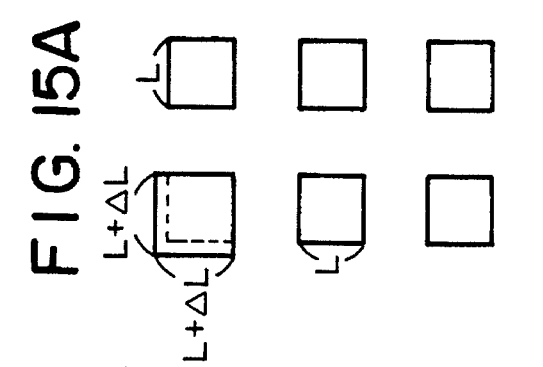
FIG. 15A FIG. 15B
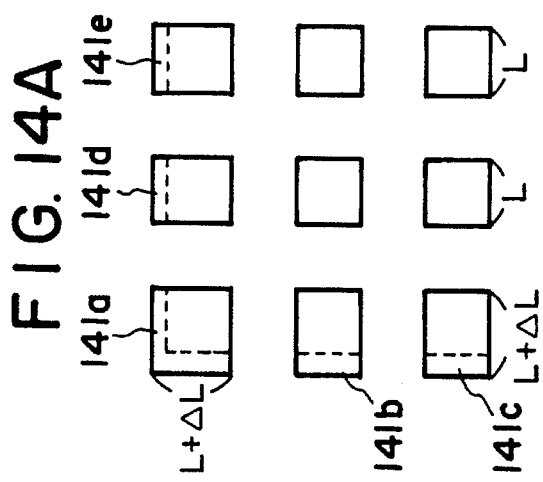
FIG. 14A FIG. 14B
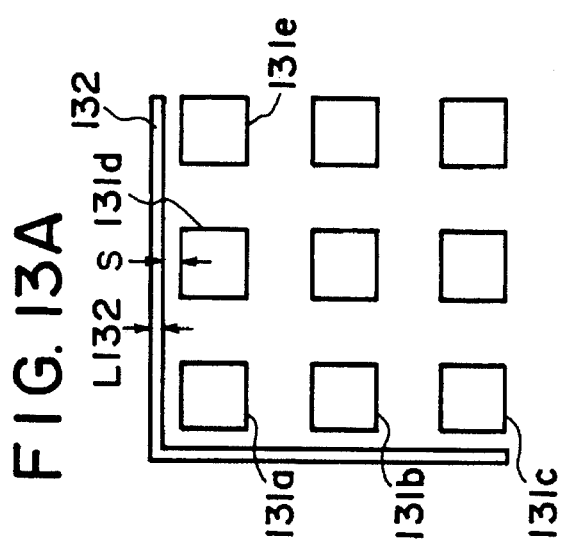
FIG. 13A FIG. 13B
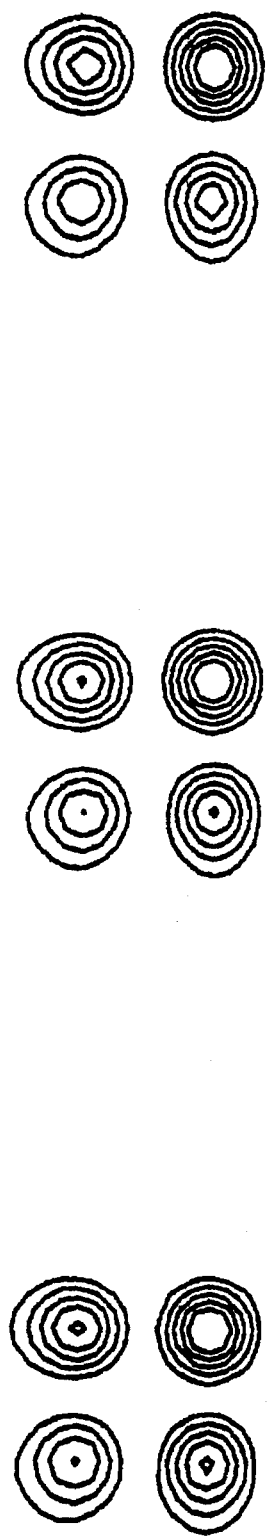

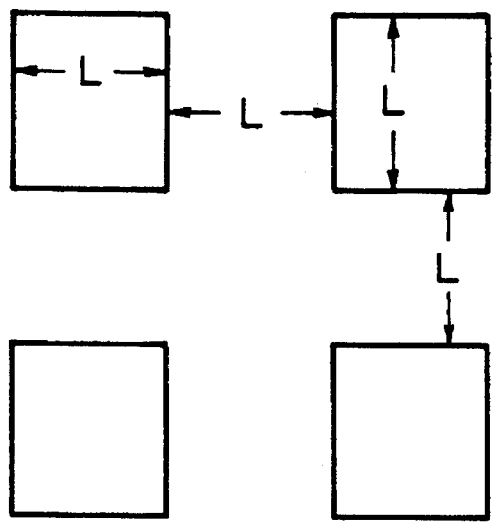
FIG. 16A
$L = 2.0$
$k_2 = \pm 1.0$
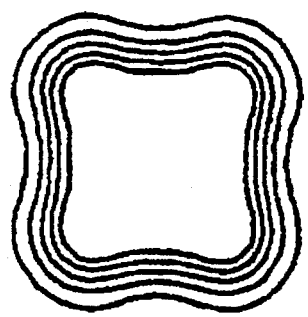 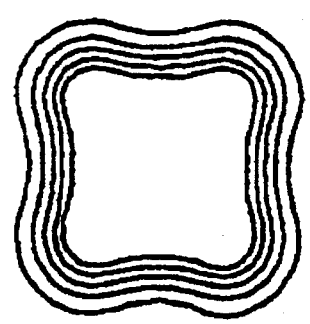
FIG. 16B
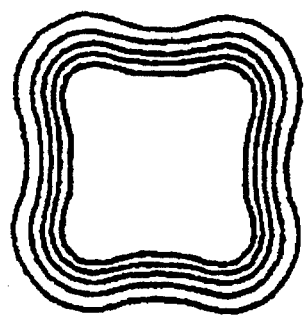 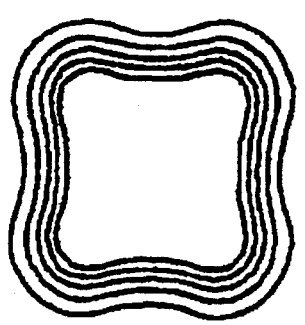

L = 2.0
S = 0.1
L171 = 0.2
L172 = 0.4

$k_2 = \pm 1.0$

007
SEMICONDUCTOR DEVICE MANUFACTURING METHOD AND PROJECTION EXPOSURE APPARATUS USING THE SAME

FIELD OF THE INVENTION AND RELATED ART

This invention relates to a semiconductor device manufacturing method and a projection exposure apparatus using the same.

Semiconductor device manufacturing technology has recently been advanced remarkably and, along with this advancement, the fine processing techniques have been improved considerably. Particularly, an optical processing technique has realized the fine processing of a submicron resolution, with the attainment of a 1 mega-DRAM device. A conventionally adopted method for improving the resolution is mainly to enlarge the numerical aperture (NA) of an optical system while maintaining the exposure wavelength. Recently, however, many attempts have been made to increase the resolution by changing the exposure wavelength from g-line to i-line, using a super-high pressure Hg lamp.

With the advancement of the exposure method using g-line or i-line as the exposure wavelength, the resist process has also been improved similarly. Thus, the optical system and the process in combination have achieved rapid advancement of optical lithography.

It is known that usually the depth of focus of a stepper is inversely proportional to the square of the numerical aperture of an optical system. This offers the problem that attaining a submicron resolution results in a smaller depth of focus.

On the other hand, many proposals have been made to improve the resolution by using a yet shorter wavelength of light, typically as in an excimer laser. It is known that generally the effect of using a shorter wavelength light is in an inverse proportion to the wavelength, and the shorter the wavelength, the greater the depth of focus is.

Separately from using a shorter wavelength of light, many proposals have been made to improve the resolution by using a phase shift mask (phase shift method). This method seeks to increase the resolution by forming, in a portion of a conventional mask, a thin film that applies a phase difference of 180 deg. to the passing light, as compared with the remaining portion. The phase shift method was proposed by Levenson, et al. (IBM corporation of U.S.A.). Where the wavelength is $\lambda$, the parameter is $k_1$ and the numerical aperture is NA, then the resolution RP is usually given by the following equation:

$$RP=k_1 \lambda/NA$$

It is known that, with this phase shift method, the parameter $k_1$ whose practical range is usually 0.7–0.8 can be improved largely to about 0.35.

As the phase shift method, there are many types such as, for example, a spatial frequency modulation type as discussed in a paper by Fukuda, et al ("Nikkei Microdevice", July, 1990, from page 108).

Actually, however, there remain many problems to be solved, in improving the resolution by using, e.g., a phase shift mask of the spatial frequency modulation type. Examples of problems are as follows:

(a) Unestablished techniques for forming a phase shift film;

(b) Unestablished CAD techniques optimized to a phase shift film;

(c) Existence of a pattern to which no phase shift film can be put;

(d) Negative type resist has to be used (in relation to the problem (c)); and (e) Unestablished techniques for inspection and correction;

Under these circumstances, the phase shift mask of spatial frequency modulation type cannot easily be used for the manufacture of semiconductor devices.

SUMMARY OF THE INVENTION

In the method using a phase shift mask the of spatial frequency modulation type, the resolution can be enhanced effectively if the mask has patterns of a cluster wherein a plurality of patterns are formed close to each other on the reticle surface.

In this method, high contrast is attained by repetition of inversion of 180 deg. of the phase of adjacent transmissive areas of patterns.

On the other hand, there is a method of improving the resolution by obliquely projecting light to the reticle surface, wherein the combination of zeroth order light and first order light from the pattern on the reticle surface or the combination of zeroth order light and negative order light pertains to the imaging.

The mechanism of attainment of enhanced resolution in this method will be that: It is now assumed that the wavelength of exposure light is $\lambda$, the numerical aperture of a projection optical system is NA, the radius of the pupil of the projection optical system is standardized to 1, and the pattern on the reticle surface comprises a grating pattern wherein transmissive areas and non-transmissive areas are arrayed with regular intervals. When the linewidth L of the pattern is $L=k_1 \cdot (\lambda/NA)$ (wherein $k_1$ is the parameter), the spacing a between the zeroth order light and the ±first order light is given by:

$$a=\tfrac{1}{2}k_1$$

Since the spacing between two transmissive areas is $2k_1$, the spacing a' of diffraction images by the repetition of plural patterns is given by:

$$a'=\tfrac{1}{4} k_1$$

Here, between peaks of wide spacing a, there are formed subsidiary peaks of spacing a', and the greater the number of repetitions of transmissive and non-transmissive areas, the sharper the diffraction images are.

Thus, sharp diffraction images are obtainable with cluster patterns, and the strength of a diffraction image of a combination of zeroth order light and first order light as received by the pupil increases. The resolution increases in this manner.

It is an object of the present invention to provide an improved semiconductor device manufacturing method or an improved projection exposure apparatus using the same, wherein the arrangement of patterns on the reticle surface and/or the manner of illuminating the patterns is set appropriately so that pattern images as projected on a wafer have substantially uniform contrast or reduced distortion, thus effectively improving the resolution.

In accordance with an aspect of the present invention, there is provided a semiconductor device manufacturing method, comprising the steps of:

illuminating obliquely an original having a grating-like pattern, with a light beam of a main wavelength $\lambda$; and projecting a portion of diffraction light produced by the pattern onto a pupil plane of a projection optical system having a numerical aperture NA, so as to project the pattern onto a predetermined plane related to a photosensitive substrate;

wherein the original has a partially isolated pattern and an auxiliary pattern;

wherein the partially isolated pattern is such a pattern having no adjoining pattern within a range of $D \leq (\lambda/NA)$ where D is the distance from one side thereof as measured on the predetermined plane;

wherein the auxiliary pattern has a linewidth L which satisfies the relation $L \leq 0.2(\lambda/NA)$ and it extends parallel to at least a portion of the partially isolated pattern;

wherein the auxiliary pattern is provided at a distance S from one side of the partially isolated pattern in the direction substantially perpendicular to the one side; and wherein the distance S is within a range of $0 \leq S \leq 0.1(\lambda/NA)$.

In accordance with another aspect of the present invention, there is provided a semiconductor device manufacturing method, comprising the steps of:

illuminating obliquely an original with a light beam of a main wavelength $\lambda$; and projecting a portion of diffraction light produced by the pattern onto a pupil plane of a projection optical system having a numerical aperture NA, so as to project the pattern onto a predetermined plane related to a photosensitive substrate;

wherein the original has grating patterns which have a linewidth L as measured on the predetermined plane, and which are disposed periodically with a spacing L as measured on the predetermined plane;

wherein the original further has a partially isolated pattern which is such a pattern having no adjoining pattern within a range of $D \leq (\lambda/NA)$ where D is the distance from one side thereof as measured on the predetermined plane; and wherein the partially isolated pattern has a linewidth La as measured on the predetermined plane which linewidth satisfies the relation $L \leq La \leq L+0.2(\lambda/NA)$.

In accordance with a further aspect of the present invention, there is provided a semiconductor device manufacturing method, comprising the steps of:

illuminating obliquely an original having a grating-like pattern, with a light beam of a main wavelength $\lambda$; and projecting a portion of diffraction light produced by the pattern onto a pupil plane of a projection optical system having a numerical aperture NA, so as to project the pattern onto a predetermined plane related to a photosensitive substrate;

wherein the original has a partially isolated pattern and a phase shift film;

wherein the partially isolated pattern is such a pattern having no adjoining pattern within a range of $D \leq (\lambda/NA)$ where D is the distance from one side thereof as measured on the predetermined plane, in a direction substantially perpendicular thereof; and wherein the phase shift film is provided at opposite sides of at least one pattern other than the partially isolated pattern.

In accordance with a yet further aspect of the present invention, there is provided a projection exposure apparatus, comprising:

means for illuminating obliquely an original having a grating-like pattern, with a light beam having a main wavelength $\lambda$; and a projection optical system for projecting the pattern onto a predetermined plane related to a photosensitive substrate, wherein said projection optical system a numerical aperture NA and wherein a portion of diffraction light produced by the pattern is projected on a pupil plane of said projection optical system;

wherein the original has a partially isolated pattern and an auxiliary pattern;

wherein the partially isolated pattern is such a pattern having no adjoining pattern within a range of $D \leq (\lambda/NA)$ where D is the distance from one side thereof as measured on the predetermined plane;

wherein the auxiliary pattern has a linewidth L which satisfies the relation $L \leq 0.2(\lambda/NA)$ and it extends parallel to at least a portion of the partially isolated pattern;

wherein the auxiliary pattern is provided at a distance S from one side of the partially isolated pattern in the direction substantially perpendicular to the one side; and wherein the distance S is within a range of $0 \leq S \leq 0.1(\lambda/NA)$.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of a main portion of a first embodiment of the present invention wherein a semiconductor device manufacturing method of the invention is applied to a projection exposure apparatus.

FIGS. 6A and 6B are illustrations of conventional successive patterns and intensity distributions of projected pattern images.

FIGS. 7A and 7B are illustrations of successive patterns of the present invention and intensity distributions of projected pattern images.

FIGS. 13A and 13B are illustrations of patterns of another form of the present invention and intensity distributions of projected pattern images.

FIGS. 14A and 14B are illustrations of patterns of yet another form of the present invention and intensity distributions of projected pattern images.

FIGS. 15A and 15B are illustrations of patterns of a further form of the present invention and intensity distributions of projected pattern images.

FIGS. 16A and 16B are illustrations of conventional patterns and intensity distributions of projected pattern images.

DESCRIPTION OF THE PREFERRED EMBODIMENTS

Figure 2A:
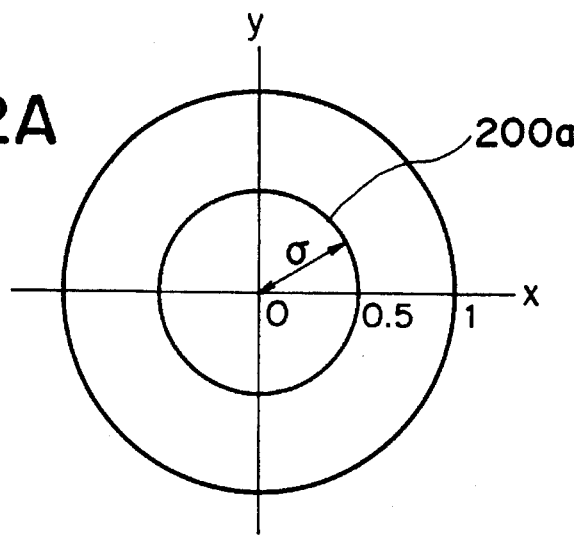
FIGS. 2A–2C are illustrations of light intensity distributions on a pupil plane of a projection optical system of FIG. 1.

FIG. 1 is a schematic view of a main portion of an embodiment wherein a semiconductor device manufacturing method of the present invention is applied to a projection exposure apparatus.

In FIG. 1, denoted at M is a reticle on which a circuit pattern (fine pattern) of such structure that is particularly specific to the present invention is formed, as will be described later. Denoted at W is a wafer to which a resist is applied. Denoted at 10 is an optical axis of the projection exposure apparatus, and denoted at 20 is a light source (primary light source) which emits a light beam of a wavelength $\lambda$. Denoted at 30 is an illumination optical system for projecting the light from the light source 20 to the reticle M, and denoted at 30A is an aperture stop (stop) of the illumination optical system 30 which is disposed adjacent to the light exit surface of the optical integrator (fly's eye lens system) (not shown) of the illumination optical system 30 and which cooperates with the optical integrator to form a secondary light source at its aperture.

Denoted at 40 is a reticle stage for holding the reticle M, and denoted at 50 is a projection lens system (projection optical system) for projecting a reduced image of the circuit pattern of the reticle M as illuminated uniformly by the light beam from the secondary light source (of ring-like shape) of the illumination optical system 30. It has a numerical aperture of NA. Denoted at 50A is an aperture stop (stop) of the projection lens system 50, and it serves to define the pupil of the projection lens system. Here, description will be made on an assumption that the position of the aperture of the stop 50A is the pupil position. Denoted at 60 is a wafer stage for holding the wafer W. It holds the wafer W so that the wafer W surface coincides with the imaging plane of the circuit pattern of the reticle M by the projection lens system 50.

In this structure, when the reticle M is illuminated by using the light source 20 and the illumination optical system 30, diffraction light as caused by the circuit pattern (mainly consisting of a combination of longitudinal and transverse patterns) of the reticle M is received by the aperture of the stop 50A of the projection lens system 50 which in turn serves to project, with the diffraction light, an image of the circuit pattern of the reticle M on the wafer W. By this, the image of the circuit pattern is transferred to the resist on the wafer W. Through the exposure-transfer process such as above, semiconductor devices can be manufactured from a wafer W.

In the projection exposure apparatus of FIG. 1, the position of the stop 30A of the illumination optical system 30 and the position of the stop 50A of the projection lens system 50 are determined to be optically conjugate with each other, and the image of the stop 30A aperture (secondary light source) is projected on the aperture of the stop 50A of the projection lens system 50. Thus, by determining the shape or size of the stop 30A aperture (shape or size of the secondary light source) appropriately, the shape or size of the image of the stop 30A aperture (i.e., the effective light source) as formed on the stop 50A aperture (i.e., the pupil) is determined. It is added here that the stop 50A aperture has a circular shape.

In the present invention, related components are so set as to provide a light intensity distribution on the stop 50A aperture (pupil plane) wherein the intensity is higher in a peripheral region than in a central region.

Figure 2B:
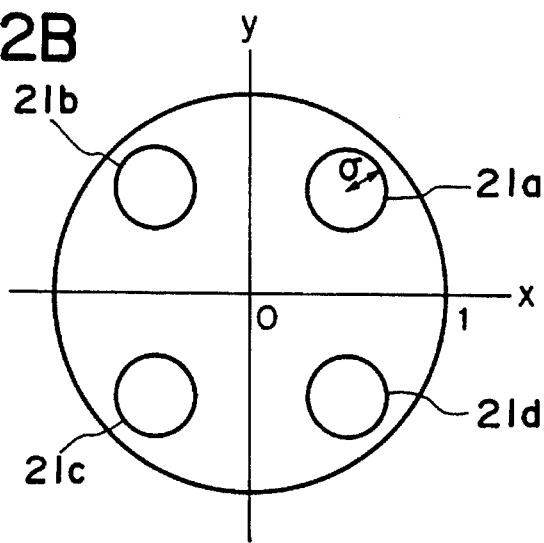
Figure 2C:
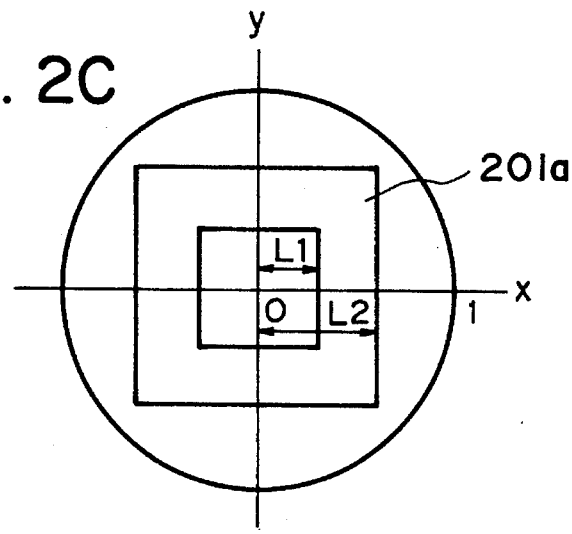

FIGS. 2A–2C are schematic illustrations of a typical light source image of an effective light source as formed on the pupil of the projection lens system (hereinafter, this pupil will be referred to as "pupil 50A") of the projection exposure apparatus, wherein the radius of the pupil is taken as "1". In these drawings, the pupil 50A and the effective light source are illustrated in the x-y coordinate system having an origin at the center of the pupil 50A of the projection lens system 50. The x axis of this x-y coordinate system corresponds to the lengthwise direction of transverse patterns (linear patterns extending in the "transverse" direction) of the reticle M, while the y axis of the x-y coordinate system corresponds to the lengthwise direction of longitudinal patterns (linear patterns extending in the "longitudinal" direction) of the reticle M.

More specifically, FIG. 2A shows a light source image as formed in accordance with a conventional illumination method. This illustration is given so as to show the difference from the illumination method according to the present invention. In the FIG. 2A case, an effective light source 200a of circular shape is formed inside a circle of a radius $\sigma=0.5$ about the origin of the pupil 50A.

FIG. 2B illustrates a case where the illumination method according to a form of the present invention is used and, in this case, four circular effective light sources 21a–21d each having a radius $\sigma=0.2$ are formed on straight lines of angles $\theta=45$ (deg), 135 (deg), 225 (deg) and 270 (deg), respectively, as measured counterclockwise with respect to the x axis. These effective light sources 21a–21d of FIG. 2B have respective center coordinates (0.5, 0.5), (−0.5, 0.5), (−0.5, −0.5) and (0.5, −0.5).

FIG. 2C illustrates a case where the illumination method according to another form of the present invention is used and, in this case, two squares having sides $2L_1$ and $2L_2$, respectively, are defined about the origin of the pupil 50A and an effective light source is formed in a ring-like region (intermediate region) 201a defined between these two squares. In this drawing, $L_1=0.3$ and $L_2=0.6$.

The effective light source to be formed on the pupil 50A in accordance with the illumination method of the present invention may have any shape, provided that the light intensity is higher in the peripheral region than in the central (origin) region. A possible example will be that on the pupil 50A effective light sources adjoin with each other through weak light portions.

In accordance with the present invention, light is obliquely projected to the reticle, and a pair of resultant zeroth order light and first order diffraction light or a pair of resultant zeroth order light and negative first order light from the circuit pattern on the reticle surface is used. Also, these diffraction lights of that pair are so projected that they are incident at equal distances from the center of the pupil and they are imaged.

Namely, in accordance with the present invention, a pair of diffraction lights (i.e., a zeroth order and a positive or negative first order light) of a circuit pattern of high spatial frequency are efficiently produced by an effective light source while, on the other hand, such diffraction light of the circuit pattern that tends to degrade the image performance is not produced by the effective light source.

Next, the feature of a circuit pattern (fine pattern) of a reticle M according to the present invention will be explained. The circuit pattern to be formed on a reticle surface in accordance with the present invention may have such structure that it comprises a plurality of grating patterns which are successively and repeatedly disposed and also that, when the illumination method of the present invention as described just above is used, the light intensity distributions (contrast) of the grating pattern images formed on the surface of a wafer can be improved and, yet, all the grating pattern images have approximately uniform intensity distributions.

First, the manner of attaining uniform contrast of grating pattern images will be explained.

Figure 3A:
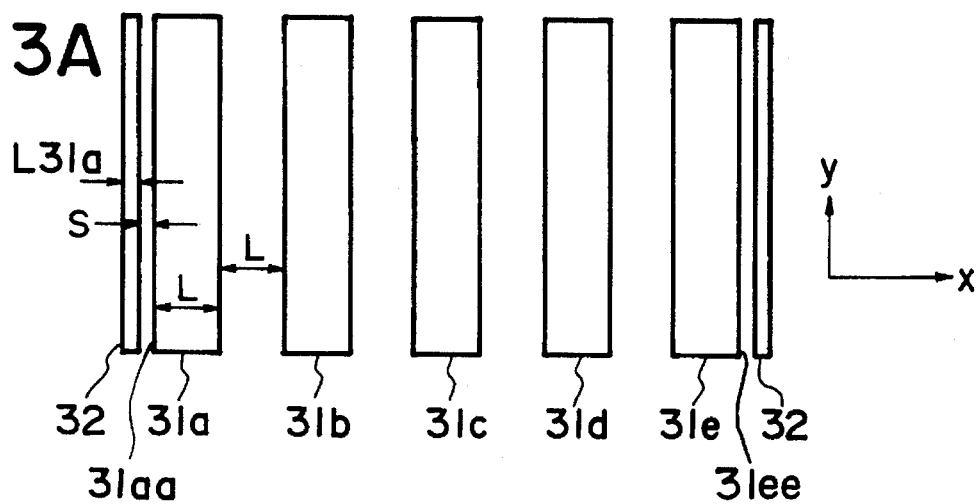
FIGS. 3A–3C show circuit patterns according to the present invention.
Figure 3B:
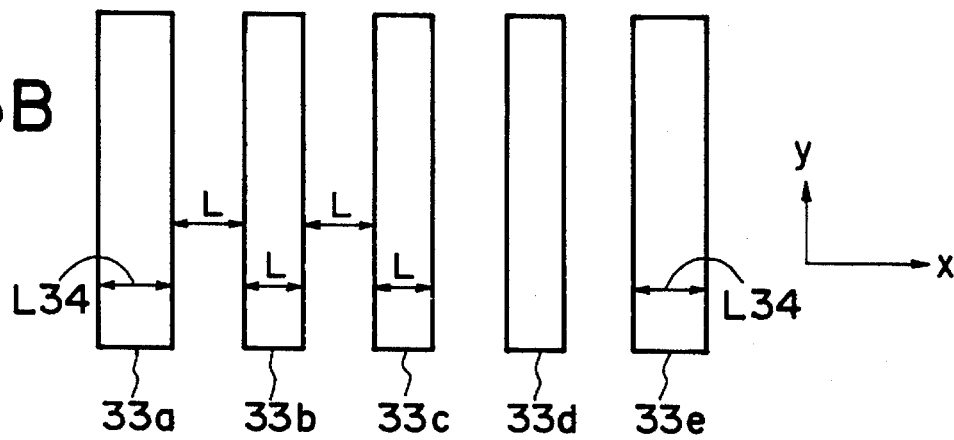
Figure 3C:
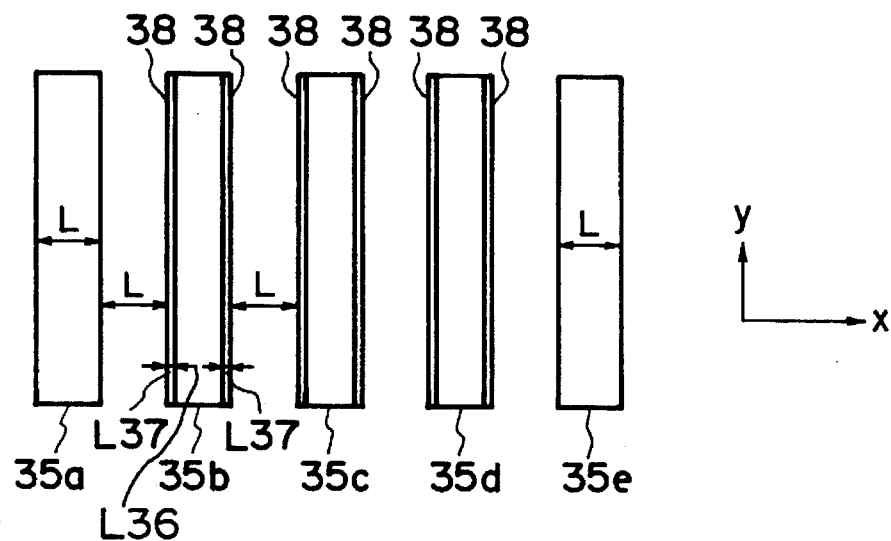

FIGS. 3A–3C illustrate circuit patterns according to the present invention. Here, examples have been taken to such circuit patterns each comprising a plurality of grating patterns arrayed successively (periodically). In the examples of FIGS. 3A–3C, each circuit pattern comprises five grating patterns. The linewidth and spacing of these grating patterns are so set that on the wafer surface they are equal to L ($L=0.5\lambda/NA$). The dimension concerning the grating pattern, to be referred to, is the magnitude as measured on the wafer surface.

In this specification, the distance as measured from one side of a grating pattern image (linewidth L), projected on the wafer surface, along the direction perpendicular thereto (i.e., the direction of the array of the grating patterns, namely, the x direction) is defined as D, and that such a grating pattern that has no neighboring grating pattern in the range of $D \leq \lambda/NA$ is defined as a "partially isolated pattern".

In FIG. 3A, patterns 31a and 31e are partially isolated patterns. Also, there are provided auxiliary patterns 32. Each auxiliary pattern extends in parallel to one side 31aa (31ee) of the partially isolated pattern 31a (31e) (i.e. it extends along the y direction) and it has a linewidth $L_{31a}$ which satisfies the following relation:

$$L_{31a} \leq 0.2(\lambda/NA)$$

Also, it is formed in a region of a distance S from the one side 31aa (31ee) in the direction (x direction) perpendicular thereto, wherein the distance S satisfies the following relation:

$$S \leq 0.1(\lambda/NA)$$

Hereinafter, such a pattern will be referred to as an "auxiliary pattern".

In FIG. 3B, grating patterns 33a–33e of a circuit pattern each has a linewidth L, and they are arrayed periodically with a spacing L. Partially isolated patterns 33a and 33e each has a line width $L_{34}$ which satisfies the following relation:

$$L=L_{34} \leq L+0.2(\lambda/NA)$$

All of the spacings between the patterns, through which no light passes, have a length L. Also, only the outermost patterns have a linewidth $L_{34}$. Namely, the spacing between the centers of the partially isolated pattern 33a (33e) and the adjacent grating pattern 33b (33d) is equal to $(3 \times L + L_{34})/2$. Hereinafter, such a pattern will be referred to as "linewidth converted pattern".

In FIG. 3C, some of the grating patterns other than partially isolated pattern 35a and 35e (in this case, the grating patterns 35b, 35c and 35d) each is provided with phase shift films 38 at its opposite sides. The phase shift film 38 serves to apply a predetermined phase shift (e.g., 180 deg) as compared with the light passing through a different region (e.g., the region in which no grating pattern is formed). Thus, no phase shift films are provided on the partially isolated patterns 35a and 35e.

Here, the phase shift film 38 has a linewidth $L_{37}$ which satisfies the following relation:

$$L_{37} \leq 0.2(\lambda/NA)$$

Also, the grating patterns 35b, 35c and 35d each has a linewidth $L_{36}$ which satisfies the following relation:

$$L-2\times L_{37} \leq L_{36} \leq L+2\times L_{37}$$

Also, the spacing between the centers of the grating patterns 35a–35e is equal to $2\times L$. Hereinafter, such a pattern will be referred to as a "partial edge emphasis pattern".

Next, the light intensity distributions (contrast) of grating pattern images on the wafer surface where the circuit patterns shown in FIGS. 3A–3C are use, will be explained ("best focus").

Figure 4A:
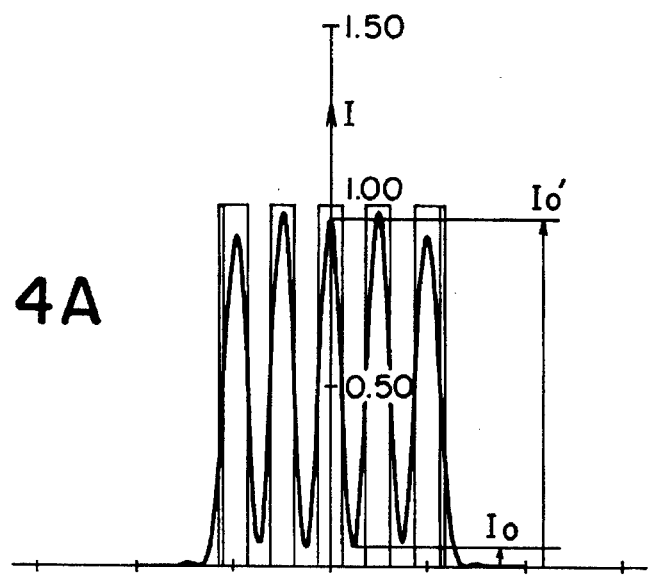
FIGS. 4A–4C are illustrations of intensity distributions of projected pattern images when the circuit patterns of FIGS. 3A–3C are used.
Figure 4B:
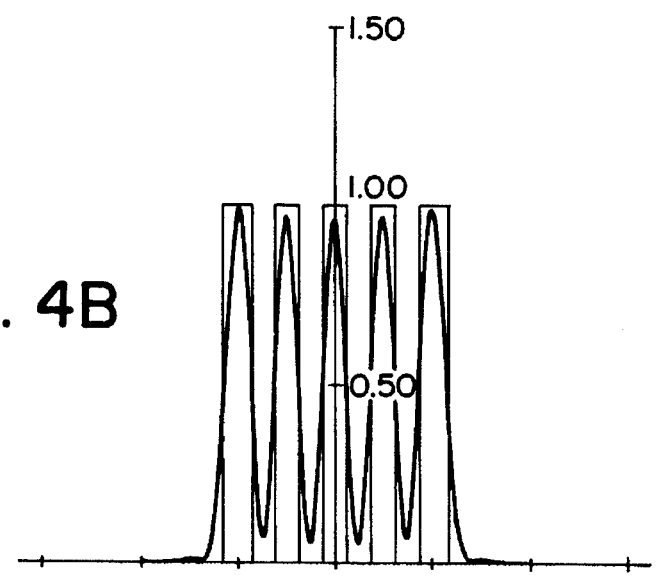
Figure 4C:
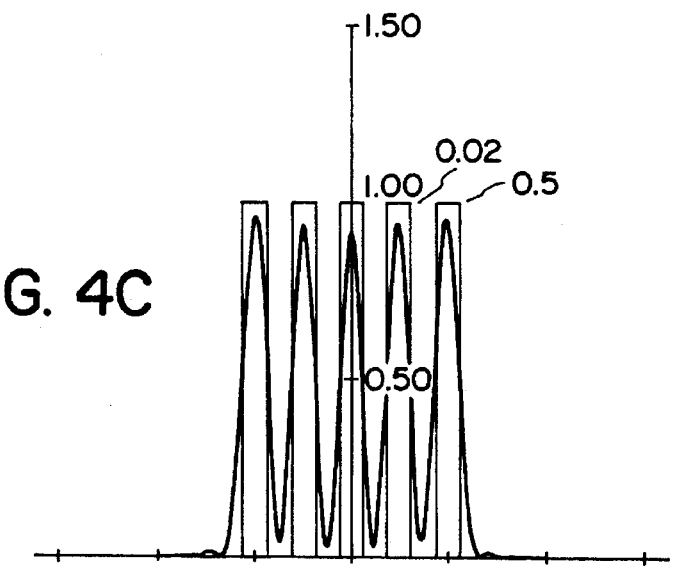

FIG. 4A–4C are illustrations of intensity distributions of circuit pattern images on the wafer surface where the circuit patterns of FIGS. 3A–3C are used.

FIG. 4A corresponds to a case where, in the circuit pattern of FIG. 3A, $S=0.025(\lambda/NA)$ and $L_{31a}=0.05(\lambda/NA)$.

FIG. 4B corresponds to a case where, in the circuit pattern of FIG. 3B, the linewidth $L_{34}=L+0.1$ and $L=0.5$.

FIG. 4C corresponds to a case where, in the circuit pattern of FIG. 3C, the linewidth $L_{37}$ of the phase shift film 38 is $L_{37}=0.2(\lambda/NA)$ and central three grating patterns 35b, 35c and 35d are provided with phase shift films 38.

Figure 5A:
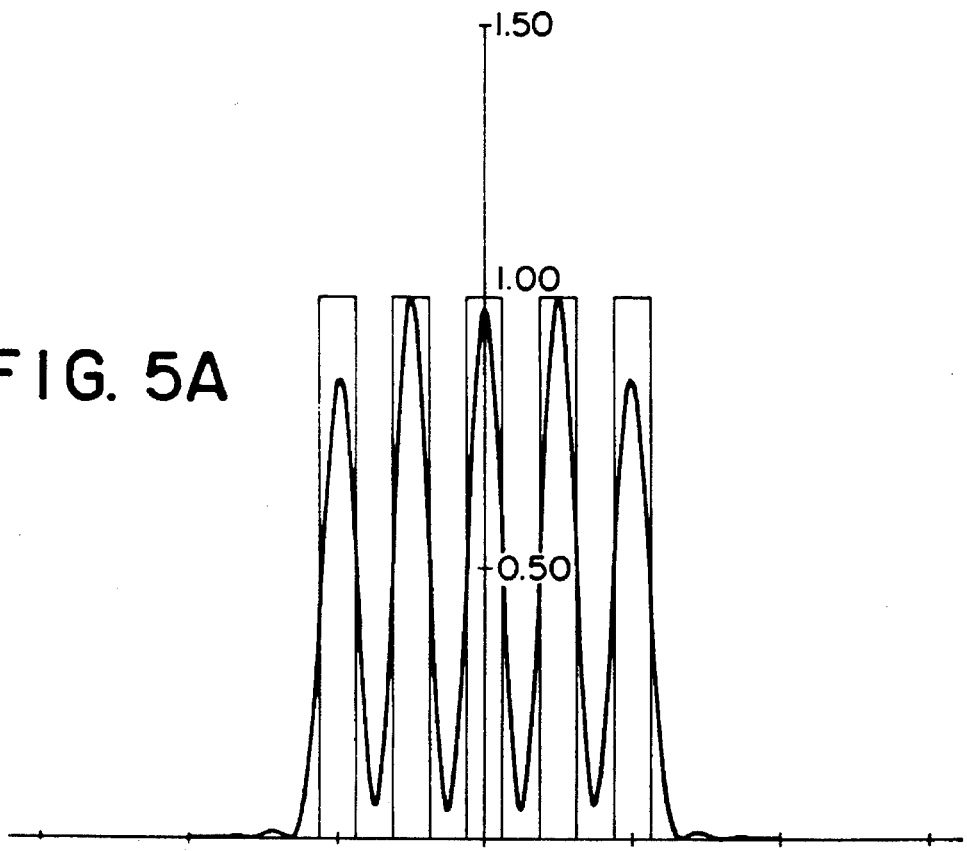
FIGS. 5A and 5B are illustrations of intensity distributions of projected pattern images when a conventional circuit pattern is used.

FIG. 5A corresponds to a case where, as a conventional circuit pattern, five grating patterns (five-grating pattern) are used. It shows an intensity distribution, in the best focus state, of five grating pattern images on the wafer surface, with a linewidth L and a spacing L.

Figure 5B:
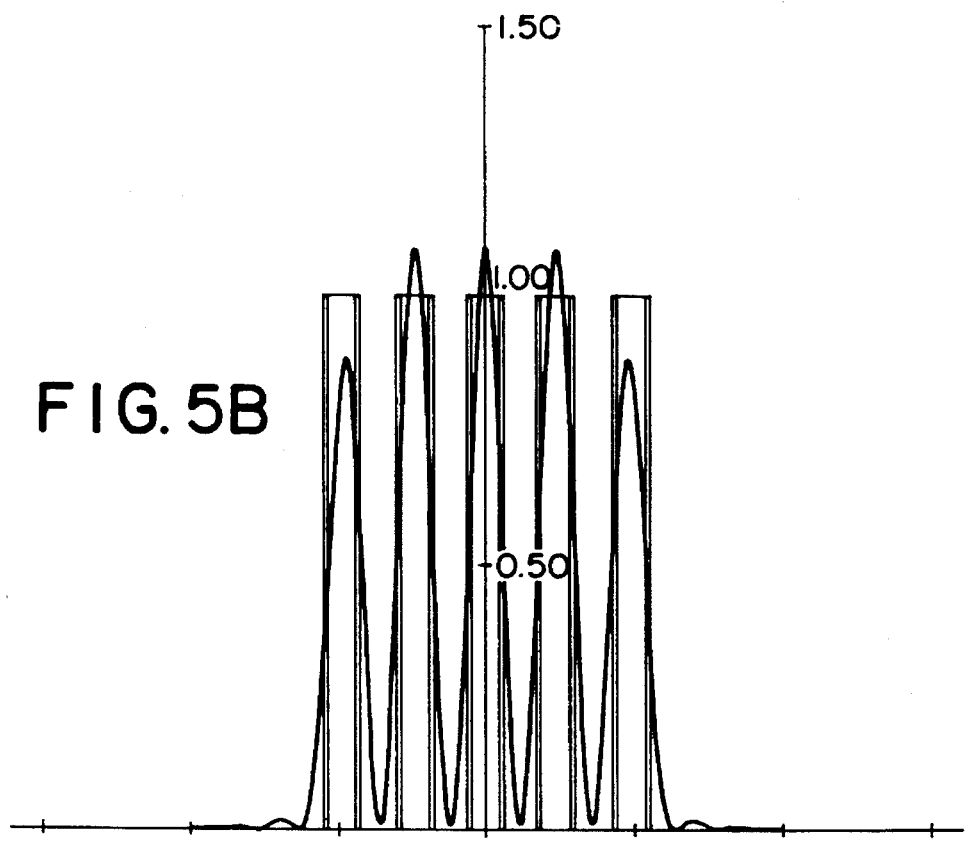

FIG. 5B shows an intensity distribution of grating pattern images in a case where a conventional grating pattern (edge emphasis pattern) is used wherein, as a circuit pattern, five grating patterns of a linewidth L and a spacing L are used and wherein each grating pattern is provided with phase shift films of linewidth 0.2 ($\lambda/NA$) at the opposite sides.

As illustrated in FIGS. 5A and 5B, if a conventional circuit pattern or a conventional phase shift film is used, in plural grating pattern images, the intensity is lower in the outside grating pattern images than in the inside grating pattern image or images.

As compared therewith, when a circuit pattern such as shown in FIGS. 3A, 3B or 3C is used, the intensity of the outside grating pattern images increases such as illustrated in FIGS. 4A, 4B or 4C, and all the grating pattern images have substantially uniform intensity.

Namely, by using the illumination method and a circuit pattern according to the present invention. it is possible to increase the resolutions of all the grating pattern images averagely.

According to the results of exposure experiments, it has been confirmed that, with conventional patterns, the linewidth of the outermost two patterns is smaller than that of the central three patterns (the uniformness is not good) but that, with the illumination method of FIGS. 3A through 3C, the linewidth of the five patterns becomes substantially even (the uniformness is improved).

Table 1 below shows dispersion of intensity distribution where the maximum intensity of the grating pattern image is $I_0'$ and the minimum intensity is $I_0$ as well as dispersion of contrast C ($C=(I_0'-I_0)/(I_0'+I_0)$), in conjunction with a case where conventional circuit patterns are used and a case where circuit patterns of the present invention is used.

TABLE 1

| TYPE OF CIRCUIT PATTERN | DISPERSION OF INTENSITY | DISPERSION OF CONTRAST |
| --- | --- | --- |
| AUXILIARY | 0.070 | 0.033 |
| LINEWIDTH CONVERTED | 0.038 | 0.030 |
| PARTIAL EDGE EMPHASIS | 0.028 | 0.045 |
| FIVE-GRATING | 0.160 | 0.037 |
| EDGE EMPHASIS | 0.272 | 0.095 |

It is seen that the uniformness of contrast is improved slightly. By this, sagging or taper at the opposite ends is improved and the uniformness of slant angle (wall angle) of the pattern is improved.

Although FIGS. 4A through 4C and 5A and 5B show only the best focus state, even in the defocus state the intensity peak and the contrast can be improved with cluster patterns and the illumination system of the present invention. Further, when the method of FIGS. 3A through 3C is used, as in the best focus state both the linewidth and the wall angle can be improved as in the cluster patterns. Thus, the depth increases resultantly.

Next, description will be made of the manner of correcting a distortion in shape of projected pattern images mainly due to what can be called an "adjoining effect", in this embodiment, and thus improving the resolution.

In a case of longitudinal and transverse grating patterns such as shown in FIG. 6A, the adjoining effect is not even because of the difference between presence and absence of any adjoining pattern. Thus, in the projected pattern image of the outermost pattern 61, distortion appears in the region adjoining to the pattern.

FIG. 6B shows, with contour lines of the intensity distribution, such a distortion of projected pattern images as detected by two-dimensional simulation. The contour lines correspond to the intensity I of I=0.2, 0.3, 0.4, 0.5 and 0.6, respectively. This is also the case with the other illustrations concerning the intensity distributions of projected pattern images. As shown in FIG. 6B, among the patterns of $k_2=\pm 0.5$, distortion appears in that region of the partially isolated pattern 61 which adjoins the pattern.

In the present invention, in consideration of this, auxiliary patterns 72 such as shown in FIG. 7A are provided in those areas at one side of the partially isolated pattern 71 which have no adjoining pattern. Here, the auxiliary pattern 72 is spaced from the pattern 71 by a distance S which satisfies the following relation:

$0<S<0.1$,

Also, it has a width $L_{72}$ which satisfies the following relation:

$0<L_{72}<0.2$

FIG. 7B illustrates intensity distributions of projected pattern images where auxiliary patterns 72 are provided such as shown in FIG. 7A. It is seen from FIG. 7B that the provision of auxiliary patterns is effective to correct the distortion of the projected pattern image.

In this manner, in the present invention, distortion of projected pattern images where successive patterns are projected can be reduced, such that balanced resolution can be retained.

Figure 8A:
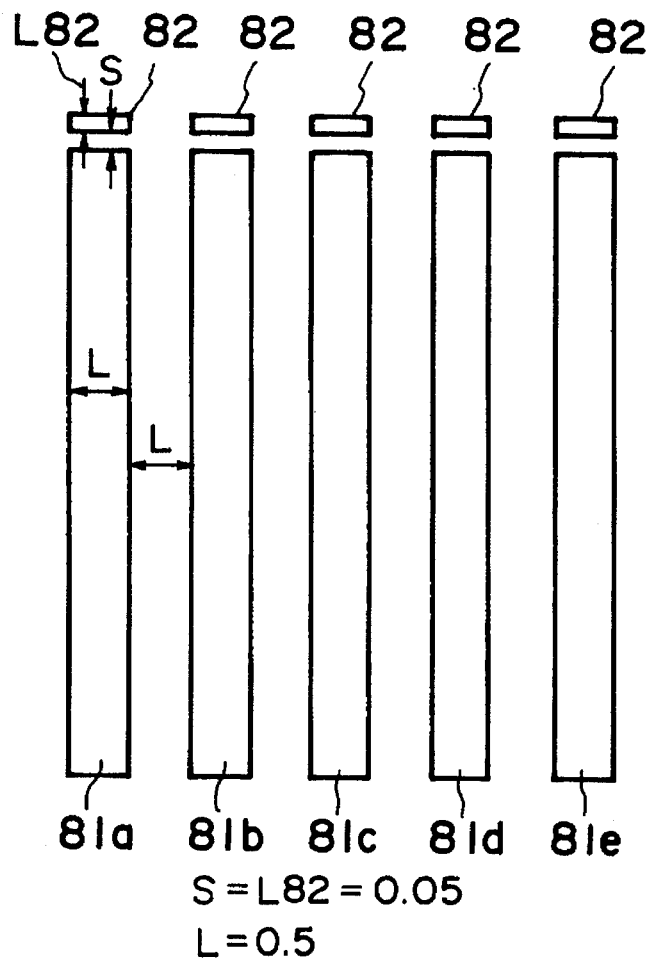
FIGS. 8A and 8B are illustrations of successive patterns of another form of the present invention and intensity distributions of projected pattern images.

FIG. 8A illustrates a case where auxiliary patterns 82 are provided at end portions of patterns so as to correct distortion at the peripheral end portions of successive patterns 81a–81e. In this case, the longitudinal patterns 81a–81e and the auxiliary patterns 82 are spaced by a distance S which satisfies:

$0<S<0.1$.

Also, the auxiliary patterns 82 have a width $L_{82}$ which satisfies the following relation:

$0<L_{82}<0.2$.

Figure 8B:
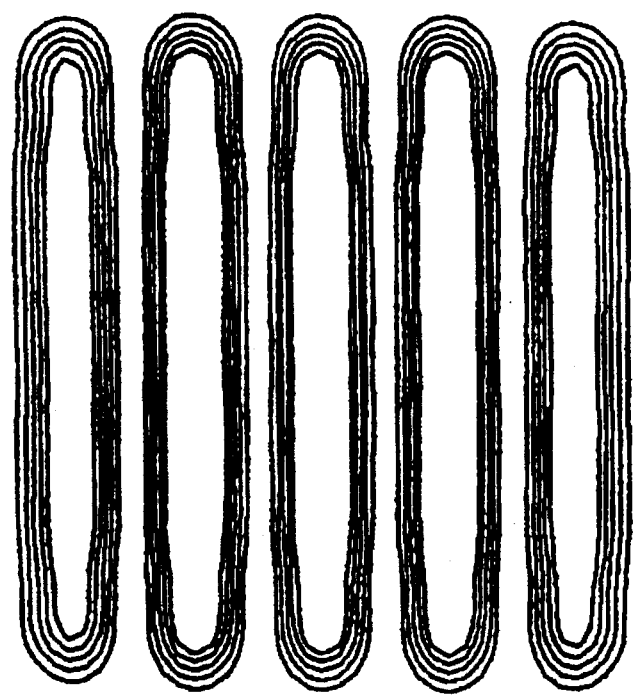

FIG. 8B illustrates intensity distributions of projected pattern images of this case.

Figure 9A:
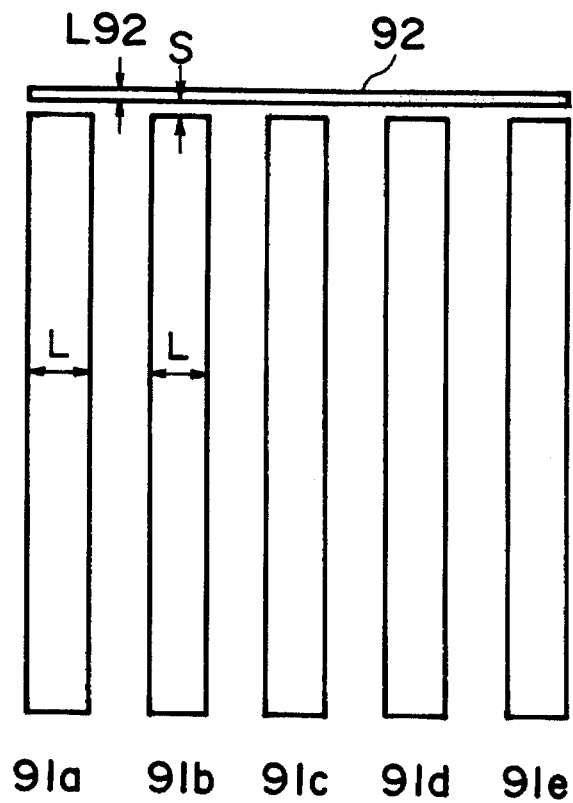
FIGS. 9A and 9B are illustrations of successive patterns of another form of the present invention and intensity distributions of projected pattern images.
Figure 9B:
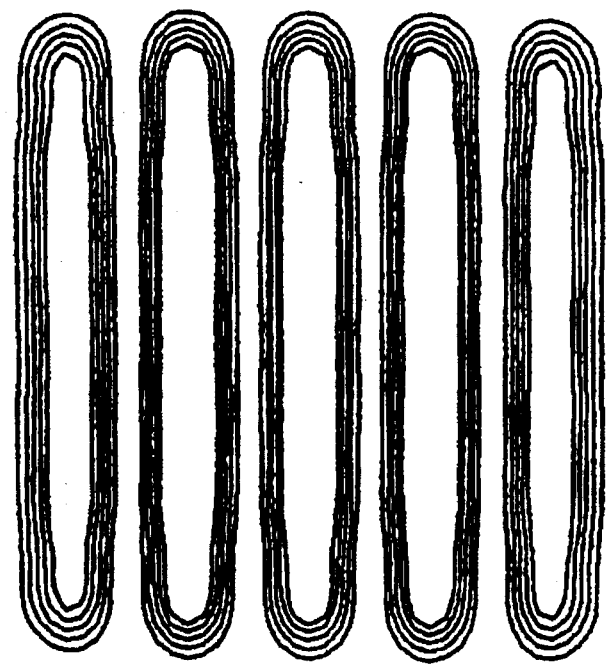

FIG. 9A shows a case where an auxiliary pattern 92 is provided continuously at the end portions of plural successive patterns 91a–91e. FIG. 9B illustrates contour lines of intensity distributions of projected pattern images corresponding to FIG. 9A.

Figure 10A:
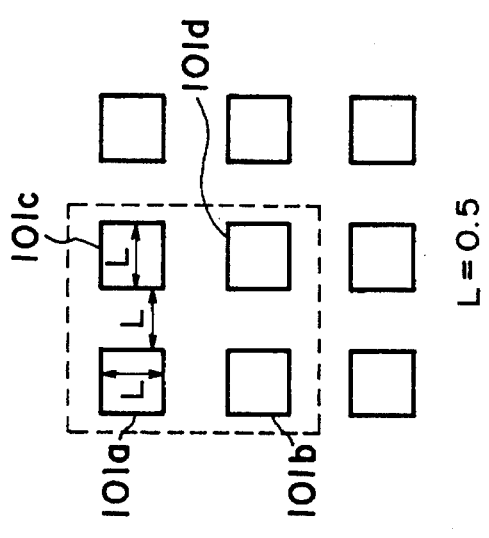
FIGS. 10A and 10B are illustrations of conventional successive patterns and intensity distributions of projected pattern images.
Figure 10B:
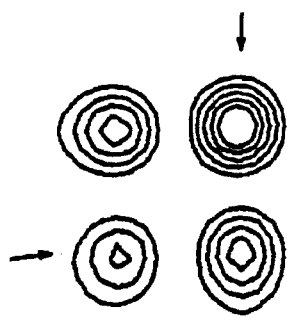

In the case of patterns such as shown in FIG. 10A, as compared with inside cluster patterns 101d, a distortion in shape of projected pattern images occur in relation to peripheral patterns (partially isolated patterns) 101a, 101b and 101c, such as illustrated in FIG. 10B.

In the present invention, in consideration of this, auxiliary patterns 112 (FIG. 11A), 122 (FIG. 12A) or 132 (FIG. 13A) are added to the peripheral patterns (partially isolated patterns) 111a–111e (FIG. 11A case), 121a–121e (FIG. 12A case) or 131a–131e (FIG. 13A case).

Figure 12A:
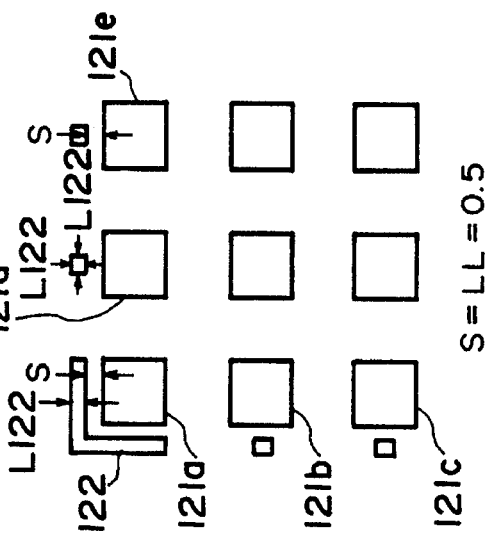
FIGS. 12A and 12B are illustrations of patterns of another form of the present invention and intensity distributions of projected pattern images.
Figure 12B:
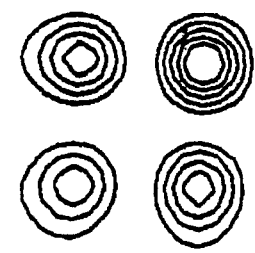
Figure 11A:
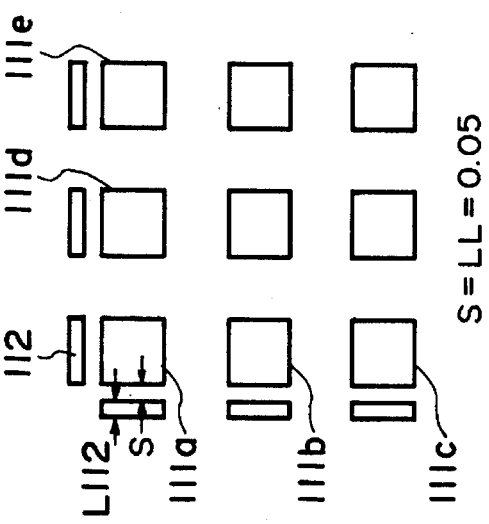
FIGS. 11A and 11B are illustrations of patterns of the present invention and intensity distributions of projected pattern images.
Figure 11B:
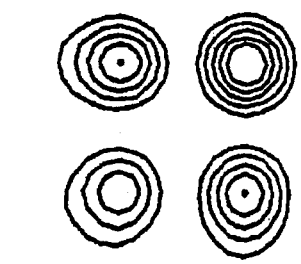

By doing so, projected pattern images with less distortion such as shown in FIGS. 11B, 12B or 13B are obtained. In the case of FIGS. 11A, 12A and 13A, the distance S of the auxiliary pattern from the partially isolated pattern is S=0.05, and the width LL of it is LL=0.05.

If in the present invention the patterns are arrays of contact holes such as shown in FIGS. 14A or 15A, the dimension of each peripheral patterns (141a–141e) may be enlarged to L+ΔL such as shown in FIGS. 12A and 12B. This effectively reduces the distortion in shape of the projected pattern images as seen in FIG. 14B and FIG. 15B.

In a case of relatively large contact holes as of $k_1 \geq 2.0$ such as shown in FIG. 16A, the adjoining effect will be small. However, when the projection lens is defocused, there occurs distortion in shape of projected pattern images such as shown in FIG. 16B.

Figure 17A:
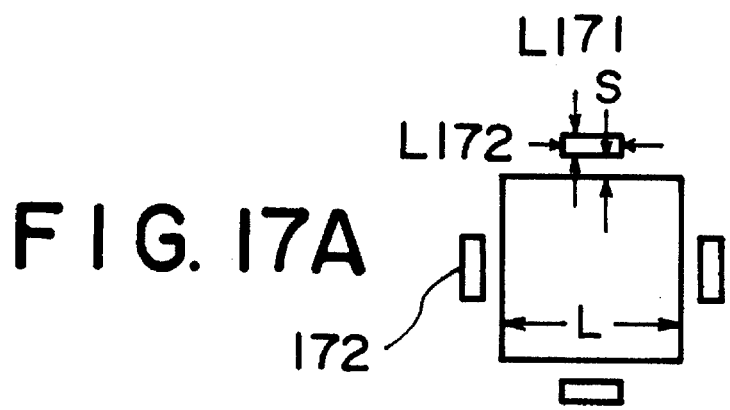
FIGS. 17A and 17B are illustrations of patterns of the present invention and intensity distributions of projected pattern images.
Figure 17B:
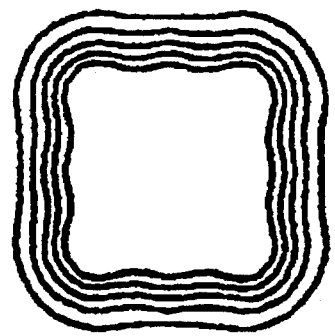

In the present invention, in consideration of this, auxiliary patterns 172 such as shown in FIG. 17A are added each in parallel to a corresponding one of the four sides of each pattern (only one pattern is illustrated in FIG. 17A), wherein the auxiliary pattern has a spacing S (0<S<0.1), a width $L_{17}$ (0<$L_{17}$<0.3) and a length $LL_{17}$ (0<$LL_{17}$<0.5). This effectively reduces the distortion in shape of projected pattern images under a defocused state, as seen in FIG. 17B.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure method for an original having a light-diffractive pattern, said method comprising the steps of:

providing an original having a grating-like pattern of opaque and light-transmissive areas, the grating-like pattern having a partially isolated pattern and an auxiliary pattern, the partially isolated pattern being a pattern having, on at least one side thereof, no adjacent pattern other than an auxiliary pattern within a range of $D \leq (\lambda/NA)$, where $\lambda$ is a wavelength of illuminating light, NA is a numerical aperture of an optical system and D is a distance from one side of the partially isolated pattern measured on an image plane, and the auxiliary pattern having a line width L which satisfies the relation $L \leq 0.2(\lambda/NA)$ and extending in a direction parallel to at least a portion of the partially isolated pattern, the auxiliary pattern being provided at a distance S from the one side of the partially isolated pattern in a direction substantially perpendicular to the one side, where S is within a range of $0 \leq S \leq 0.1(\lambda/NA)$;

illuminating obliquely the original with a light beam having a main wavelength $\lambda$; and projecting a portion of light diffracted by the grating-like pattern onto a pupil plane of a projection optical system having a numerical aperture NA, to project the grating-like pattern onto the image plane.

2. A projection exposure method for an original having a light-diffractive pattern, said method comprising the steps of:

providing an original having a grating-like pattern of opaque and light-transmissive areas, the grating-like pattern having a partially isolated pattern and a phase shift film, the partially isolated pattern being a pattern having, on at least one side thereof, no adjacent pattern within a range of $D \leq (\lambda/NA)$, where $\lambda$ is a wavelength of illuminating light, NA is a numerical aperture of an optical system and D is a distance from one side of the partially isolated pattern measured on an image plane, and the phase shift film comprising an edge emphasis type film and being provided on opposite edges of at least one pattern other than the partially isolated pattern, such that no phase shift film is provided on the partially isolated pattern;

illuminating obliquely the original with a light beam having a main wavelength $\lambda$; and projecting a portion of light diffracted by the grating-like pattern onto a pupil plane of a projection optical system having a numerical aperture NA, to project the grating-like pattern onto the image plane.

3. A projection exposure apparatus comprising:

means for illuminating obliquely an original with a light beam having a main wavelength $\lambda$, the original having a grating-like pattern of opaque and light-transmissive areas, the grating-like pattern having a partially isolated pattern and an auxiliary pattern, the partially isolated pattern being a pattern having, on at least one side thereof, no adjacent pattern other than an auxiliary pattern within a range of $D \leq (\lambda/NA)$, where $\lambda$ is a wavelength of illuminating light, NA is a numerical aperture of an optical system and D is a distance from one side of the partially isolated pattern measured on an image plane, and the auxiliary pattern having a line width L which satisfies the relation $L \leq 0.2(\lambda/NA)$ and extending in a direction parallel to at least a portion of the partially isolated pattern, the auxiliary pattern being provided at a distance S from the one side of the partially isolated pattern in a direction substantially perpendicular to the one side, where S is within a range of $0 \leq S \leq 0.1(\lambda/NA)$; and means for projecting a portion of light diffracted by the grating-like pattern onto a pupil plane of a projection optical system having a numerical aperture NA, to project the grating-like pattern onto a photosensitive plate in the image plane.

4. A projection exposure apparatus comprising:

means for illuminating an original with a light beam having a main wavelength $\lambda$, the original having a grating-like pattern of opaque and light-transmissive areas, the grating-like pattern having a partially isolated pattern and a phase shift film, the partially isolated pattern being a pattern having, on at least one side thereof, no adjacent pattern within a range of $D \leq (\lambda/NA)$, where $\lambda$ is a wavelength of illuminating light, NA is a numerical aperture of an optical system and D is a distance from one side of the partially isolated pattern measured on an image plane, and the phase shift film comprising an edge emphasis type film and being provided on opposite edges of at least one pattern other than the partially isolated pattern, such that no phase shift film is provided on the partially isolated pattern; and means for projecting a portion of light diffracted by the grating-like pattern onto a pupil plane of a projection optical system having a numerical aperture NA, to project the grating-like pattern onto a photosensitive substrate in the image plane.

* * * * *

UNITED STATES PATENT AND TRADEMARK OFFICE
CERTIFICATE OF CORRECTION

PATENT NO. : 5,587,834
DATED : December 24, 1996
INVENTOR(S) : Miyoko NOGUCHI

It is certified that error appears in the above-indentified patent and that said Letters Patent is hereby corrected as shown below:

COLUMN 1:

Line 59, "et al" should read --et al.--.

COLUMN 2:

Line 15, "the of" should read --of the--.

COLUMN 3:

Line 43, "plane" should read --plane,--.

COLUMN 4:

Line 6, "a" should read --has a--.

COLUMN 8:

Line 2, "$L=L_{34} \leqq L+0.2(\lambda/NA)$" should read --$L \leqq L_{34} \leqq L+0.2(\lambda/NA)$--.

UNITED STATES PATENT AND TRADEMARK OFFICE
CERTIFICATE OF CORRECTION

PATENT NO. : 5,587,834
DATED : December 24, 1996
INVENTOR(S) : Miyoko NOGUCHI

It is certified that error appears in the above-indentified patent and that said Letters Patent is hereby corrected as shown below:

COLUMN 10:

Line 3, "$0<S<0.1$," should read --$0<S<0.1.$--; and

Line 8, "$0<L_{72}<0.2$" should read --$0<L_{72}<0.2.$--.

Signed and Sealed this

Eighth Day of July, 1997

Attest:

BRUCE LEHMAN

Attesting Officer     Commissioner of Patents and Trademarks